United States Patent [19]

Hultzsch et al.

[11] Patent Number: 5,046,264

[45] Date of Patent: Sep. 10, 1991

[54] METHOD AND APPARATUS FOR CONTINUOUSLY DRYING BOARDS COATED ON BOTH SIDES

[75] Inventors: Guenter Hultzsch, Wiesbaden; Hermann Idstein, Oestrich-Winkel; Reinhard Nies, Wiesbaden, all of Fed. Rep. of Germany

[73] Assignee: Hoechst Aktiengesellschaft, Frankfurt am Main, Fed. Rep. of Germany

[21] Appl. No.: 517,079

[22] Filed: May 3, 1990

[30] Foreign Application Priority Data

May 10, 1989 [DE] Fed. Rep. of Germany ....... 3915278

[51] Int. Cl.$^5$ ............................................. F26B 23/04
[52] U.S. Cl. ............................................. 34/4; 34/41; 34/62
[58] Field of Search ................ 34/1, 4, 7, 62–66, 34/155, 68, 40, 41

[56] References Cited

U.S. PATENT DOCUMENTS

| | | | |
|---|---|---|---|
| 2,674,809 | 4/1954 | Meienhofer | 34/48 |
| 4,567,673 | 2/1986 | Boehnensicker | 34/23 |
| 4,619,050 | 10/1986 | Klemm | 34/4 |
| 4,683,627 | 8/1987 | Reinhold | 29/110 |
| 4,711,291 | 12/1987 | Reinhold | 164/98 |

FOREIGN PATENT DOCUMENTS

| | | |
|---|---|---|
| 966023 | 7/1949 | Fed. Rep. of Germany .......... 34/62 |
| 1772976 | 8/1971 | Fed. Rep. of Germany . |
| 2646111 | 4/1978 | Fed. Rep. of Germany . |
| 3014891 | 10/1981 | Fed. Rep. of Germany . |
| 744343 | 2/1956 | United Kingdom . |
| 2159920 | 12/1985 | United Kingdom . |

*Primary Examiner*—James C. Yeung
*Attorney, Agent, or Firm*—Foley & Lardner

[57] ABSTRACT

A method and apparatus for drying boards coated on both sides utilizes plural heating sources located within a drying zone and a plurality of conveyor rollers, located below the heating sources, which convey the boards through the drying zone. A coolant flows through the hollow interior of each of the conveyor rollers, thus cooling the outer peripheral surfaces of the rollers and the bottom surfaces of the boards. The conveyor rollers are arranged in parallel with one another and may be either horizontal or arranged in adjacent rows which are adjustably inclined towards one another to accommodate boards of varying sizes. Conveyor rollers located immediately downstream of the drying zone form a short cooling zone in which the boards are rapidly cooled for further handling.

18 Claims, 2 Drawing Sheets

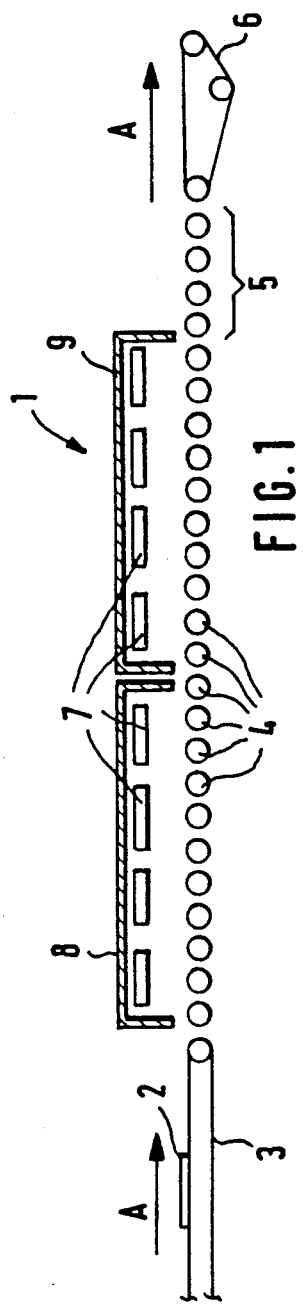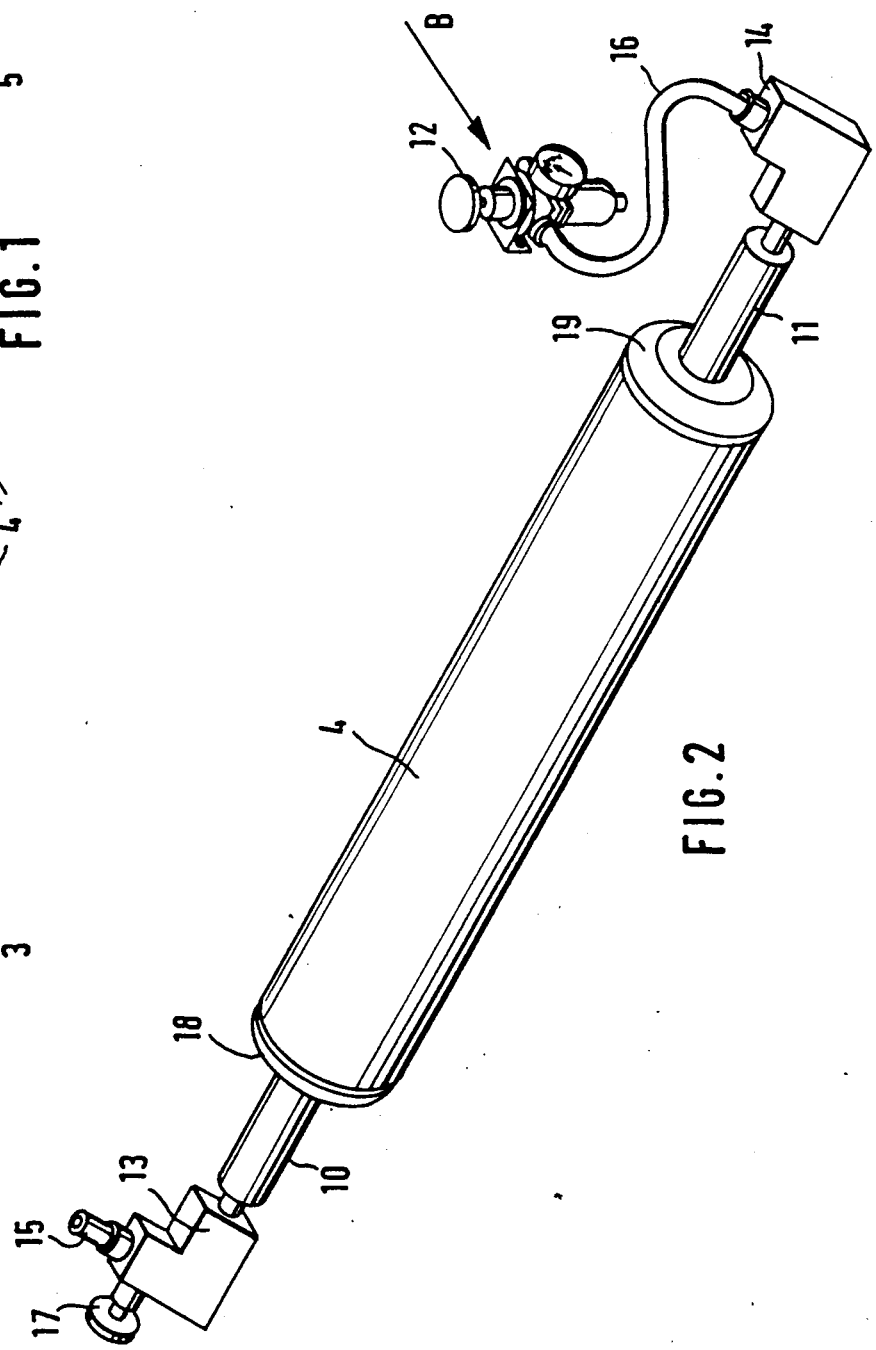

METHOD AND APPARATUS FOR CONTINUOUSLY DRYING BOARDS COATED ON BOTH SIDES

BACKGROUND OF THE INVENTION

The invention relates to a method for continuously drying boards coated on both sides which are conveyed by conveyor rollers horizontally through the drying zone, and are heated on the top side and cooled on the bottom side, and also to an apparatus for continuously drying boards coated on both sides.

To produce conductor track patterns on printed circuit boards by the photographic printing method, copper-laminated insulating material is first provided with a photosensitive layer, the etching resist or electroplating resist. In a further step, the structured conductor track patterns may be coated with photosensitive solder resists which, on the one hand, protect the unbared conductor tracks against the liquid solder in the soldering process and, on the other hand, protect them against corrosion when loaded with current, in particular at high atmospheric humidity.

Said photosensitive layers are deposited either as dry film resists by lamination or as liquid photoresists by coating followed by drying. The coating methods used for printed circuit boards are dip coating, screen printing, roller coating, curtain coating or electrostatic spraying methods.

The vast majority of the printed circuit boards have conductor tracks on both sides which are produced by photochemical methods and are mutually connected by chemical plating metallization.

The term "printed circuit board" should be understood here to mean both the copper-clad insulating base material and also the already structured printed circuit board.

The vast majority of the photosensitive liquid photoresists are composed of radiation-sensitive components, binders, sensitizers, lacquer auxiliaries and also organic solvents. Before exposure, which is carried out, as a rule, in contact with film masters from both sides, the photoresist has to be dried so that the masters do not adhere to the photoresist layers during exposure.

The master is composed, in general, of a polyester film, but it may also be a glass tool.

The photosensitive liquid resist is dried after coating by heating the resist layer to approximately 70° to 120° C. In this process, on the one hand, the solvent evaporates; on the other hand, the resist layers and the reactive components, which contain, for example, monomers or diazonium salts, become soft again on heating since the drying temperatures are above the softening temperatures of the components in the vast majority of cases. As a consequence, these already dried layers are still sensitive to mechanical contact on heating. Specific resists, in particular the photosensitive solder resist masks, soften so easily that processing difficulties may even arise, for example in the exposure frame, in which temperatures of 35° to 38° C. readily occur and in which the boards are in contact with the film master in vacuo.

Single-sided application methods such as screen printing, electrostatic spraying methods and also curtain casting have established themselves as general coating techniques. Just as in pre-cleaning and during exposure, the boards are conveyed horizontally in these processes.

Thus, German Offenlegungsschrift 1,772,976 discloses a photomechanical method for producing printed circuit boards with plated-through holes, in which method the photosensitive layer, to which the surface pattern to be etched out later has first to be transferred photographically, is applied by means of an electrostatic resist-coating method.

Printed circuit boards which are resist-coated on both sides present the requirement to produce them in a manner such that no markings or adhesions to the surface of the board side resist-coated first appear on drying the other board side. Normally, the printed circuit boards are first resist-coated on one side and pre-dried and then, after turning over, are resist-coated on the second side in the same plant or in a second plant and finally, both sides are dried completely.

One drying possibility is to lay the boards in suitable racks and to dry them in a hot-air oven. To do this, the racks have, as a rule, to be loaded manually. On the plate racks there are board support points at which adhesion may also occur. Drying boards of different formats in said racks presents a particular difficulty; for this purpose, racks of different or variable size have to be employed.

Another drying possibility in the case of double-sided resist coating is presented by horizontal continuous ovens with V-shaped belts for conveying the boards. Only the edges of the resist-coated boards lie on the V-shaped belts. Since, however, the belt is heated up as it passes through the drier, the resist softens preferentially at these support points, and this may result in adhesion or in or in contamination of the belt. The V-shaped belts are furthermore unsuitable for drying flexible or bendable printed circuit boards such as are employed as internal layers for producing multilayer boards, since such printed circuit boards may sag or droop.

Instead of a V-shaped belt, it is also possible to employ suitably bent brackets. The contact area is then smaller but the contact pressure is higher. If boards of very different size are used, the spacing of the inclined belts or the angle has to be adjusted. This is important, in particular, when drying with IR radiators since the radiator/board distance has to be as constant as possible.

In a further method for drying double-sided resist-coated boards, driers with clip-chain board conveyance are employed. Here again the clips leave imprints behind since they heat up and enter the resist layer. In this case, resist particles may remain stuck to the clips which give rise to contamination in the drier. Furthermore, the matching to the plate size has to be carried out very carefully. To convey flexible boards, the chains have additionally to keep the boards taut.

Horizontal, continuously operated driers where the boards are conveyed on chains with laterally fitted pins are also employed for drying during printed circuit board production. In that case, the top side is heated with IR radiators and the bottom side is simultaneously cooled with an air jet. This is done, as a rule, to protect the components already mounted on the bottom side against overheating. This cooling air does not, however, prevent the entire chain and the conveyor pins from being heated up during the pass, and in this process the resist coating of the bottom side may be damaged.

The imprinting of the resist at the bottom side of the board and the contamination of the conveyor system can be avoided if the coating does not take place up to the edge of the board. This requires particular measures for limiting the resist coating, which measures have to be adapted each time the board format is altered. In order that the resist coating can be limited within a few millimeters of the edge zone, the boards furthermore have to be precisely oriented in one line and run in a straight line through the coating plant. With frequent format change such as is unavoidable in printed circuit board production, this demands a high expenditure on control.

Cooling belts for cooling molten resins or polymers, the melt being poured onto an endless metal belt and the endless belt being cooled from the bottom side by means of rollers, an air jet or liquids, including, for example, liquid nitrogen, are furthermore known. In this case, it is not, however, critical whether the solidified melt is imprinted by the belt surface or not. It would also be conceivable to employ a cooled conveyor belt for printed circuit board drying. However, the production of such endless metal belts is relatively expensive and it is difficult to keep the belt continuously in contact with a cooling surface. If that does not take place, the belt may heat up rapidly owing to its low heat capacity, and this again results in resist adherence.

SUMMARY OF THE INVENTION

An object of the invention is to improve a drying method of the above-mentioned type for producing printed circuit boards resist-coated on both sides in a manner such that both rigid and also flexible printed circuit boards of different sizes can be dried in a continuously operated system without the resist coating being damaged and the conveyor apparatus for the printed circuit boards being contaminated.

In accordance with one aspect of the invention, the method for continuously drying boards includes the steps of using a plurality of conveyor rollers to convey each of the boards through a drying zone where they are heated from above. The bottom surfaces of the boards are cooled as they are conveyed through the drying zone by cooling the interior of the conveyor rollers.

In accordance with another aspect of the invention, the conveyor rollers are cooled by feeding a coolant through each of the rollers. The flow of coolant into and out of each of the rollers may be regulated to produce the desired cooling effect.

Another object of the invention is to provide an apparatus for drying boards coated on both sides while they are conveyed through a drying zone.

In accordance with one aspect of the invention, the apparatus includes a drying zone, a plurality of heating sources located within the drying zone, a plurality of conveyors, located beneath the heat sources, which convey the boards through the drying zone, and means for cooling the outer peripheral surfaces of the rollers to cool the downward-pointing surface of each of the boards as they travel over the rollers.

The cooling means according to this aspect of the invention may comprise a coolant which is fed through hollow interiors of the rollers. These hollow rollers have first and second shaft journals connected to the respective end faces thereof, and first and second rotary distributors connected to the respective shaft journals. A feed line is connected to the first rotary distributor and an outlet line is connected to the second rotary distributor.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention is explained i e detail below with reference to the drawings. In these:

FIG. 1 shows a diagrammatic sectional view of a drying apparatus with horizontally oriented conveyor rollers for the coated boards according to the invention;

FIG. 2 shows a perspective view of a conveyor roller and other elements of the drying apparatus;

DETAILED DESCRIPTION OF THE PREFERRED EMBODIMENTS

Figure 3:
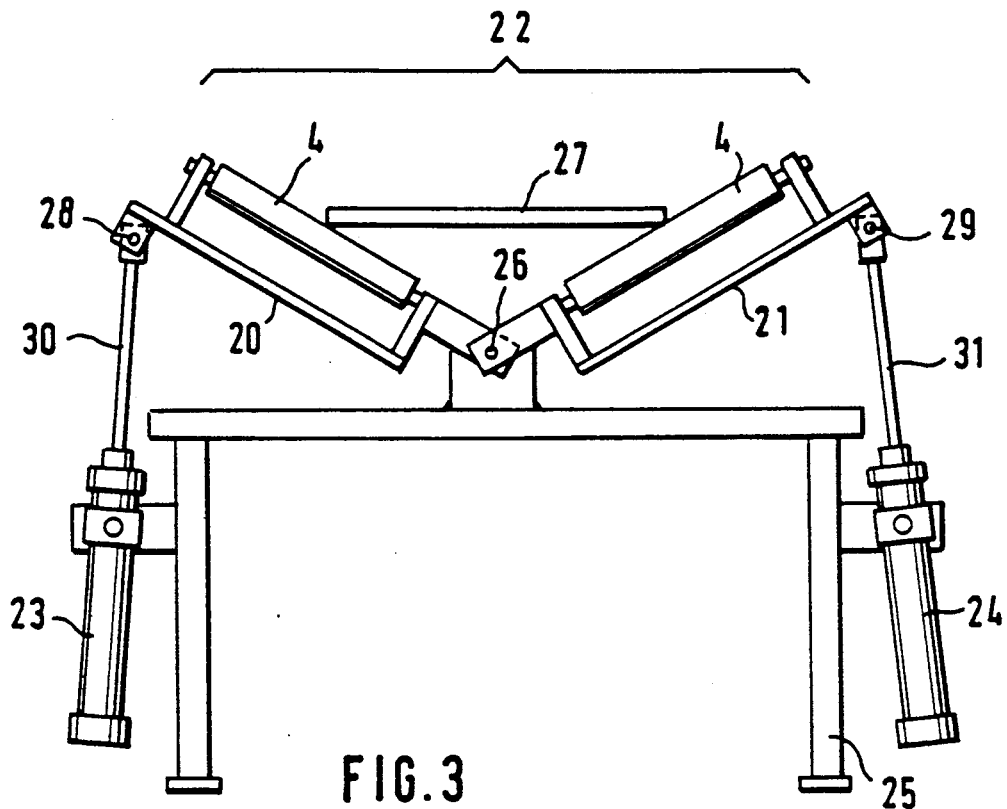
FIG. 3 shows an elevation of a further conveyor apparatus of the drying apparatus.

According to a preferred embodiment of the invention a method for drying boards coated on both sides comprises cooling every conveyor roller from the inside and removing heat via the circumferential surfaces of the conveyor rollers. In this method, a cooling medium flows through every conveyor roller.

In a development of the method, the cooling medium is fed either in an open flow system through the conveyor rollers or in a closed circuit through the conveyor rollers. In the latter case, the heat is removed from the coolant by a refrigerating system or a heat exchanger.

Expediently the temperature of the circumferential surfaces of the conveyor rollers is up to $+30°$ C. In that case, a temperature difference between the top side and the bottom side of the boards of $19°$ to $25°$ C. results.

An apparatus for continuously drying boards coated on both sides, which has a number of conveyor rollers which convey the boards horizontally through a drying zone in which the heat sources are arranged above the conveyor rollers is one wherein the individual conveyor roller is constructed as an inwardly hollow cooling roller, wherein the shaft journals adjoining both end faces of the conveyor roller are inwardly hollow and wherein every shaft journal is linked to a rotary distributor which is connected to an outlet line or a feed line, respectively, for the cooling medium.

A drying apparatus 1 shown in FIG. 1 comprises two drying zones 8 and 9 which are each surrounded by a downwardly open housing. The housings may also be closed, for example in order to prevent dust entering the drying zones from the surrounding space. Located in each drying zone 8 and 9 are a number of heat sources 7, for example IR dark-light lamps which radiate downwards. Located beneath the drying zones 8 and 9 are conveyor rollers 4 which are arranged parallel to one another and horizontally.

A coated board 2 is fed in the conveying direction A on a conveyor belt 3 into the drying apparatus 1. The board 2 is transferred from the conveyor belt 3 to the conveyor rollers 4 of the conveyor apparatus and is conveyed by the latter horizontally through the drying apparatus 1. After emerging from the drying zone 9 situated downstream in the conveying direction A, the board 2 is conveyed through a cooling zone 5 which is shorter than either of the two drying zones 8, 9 and essentially comprises conveyor rollers 4 which are cooled in the same manner as the rollers located in the drying zones 8,9. Downstream of the cooling zone 5, the board 2 is transferred to an endlessly circulating continuous conveyor belt 6.

The boards 2 are consequently conveyed horizontally through the drying apparatus 1 on the conveyor rollers 4 which are cooled from the inside, to be specific, with the freshly resist-coated side upwards. The rear (bottom) side may be non-resist-coated or resist-coated and pre-dried.

The layers carried on the top side of the board may be dried by hot air, for example from jets, or, as already mentioned, by infrared radiation, for example by so-called IR dark-light lamps, or by a combination of hot air from jets and infrared radiators. To dry or cure the resist, use may also furthermore be made of other radiation sources which produce heat such as, for example, UV radiators.

FIG. 2 shows a conveyor roller 4 with additional elements in perspective. The conveyor roller 4 is constructed as an inwardly hollow cooling roller and inwardly hollow shaft journals 10 and 11 adjoin its two end faces 18, 19. Each of said shaft journals 10 and 11 is linked to a rotary distributor 13 and 14 respectively which make it possible for the shaft journals 10 and 11 to be able to rotate without sealing losses. The rotary distributor 14 is linked to a pressure regulator 12 by a feed line 16. The cooling medium is fed in the flow direction B to the pressure regulator 12. The rotary distributor 13 is fitted with a throttle 17 which makes it possible to regulate the flow of the cooling medium. An outlet line 15 for the cooling medium emerges from the rotary distributor 13. Air or water or a special coolant composed of water, lubricating additive and an additive which delays aging of the water may be employed as gaseous or liquid cooling medium. Non-aqueous coolants such as, for example, organic solvents may also be employed. At the same time, the coolant can be fed through the conveyor rollers 4 in a closed circuit, the heat then being removed from the coolant by a refrigerating system or a heat exchanger. It is equally possible to arrange for the coolant to flow through the conveyor rollers 4 in an open flow system.

In order to obtain a good heat removal, the roller surfaces are of metallic construction, preferably also of heat-reflecting construction, and are composed, for example, of aluminum or other metals. A high heat reflection achieves the result that the heat absorption of the rollers is only small. Correspondingly, it is then possible to employ a low cooling power.

The roller surface may be coated either with a resist-repelling coating, for example of fluorinated hydrocarbons, silicone polymers or other suitable plastics, or with inorganic coatings, for example aluminum oxide.

The conveyor rollers are arranged in the horizontal plane so that either rigid or flexible printed circuit boards, for example for multilayer inner layers, or metallized films may be conveyed. At the same time, the spacing of two conveyor rollers is equivalent to half the smallest format length or less. The conveyor rollers all have the same outside diameter and are driven, for example, by means of a chain conveyor system. The rotary speed is variable in order to regulate the speed at which the board is conveyed through the apparatus.

All types of boards 2 can be dried in the conveyor apparatus 1 with conveyor rollers 2 arranged horizontally and in parallel.

Figure 4:
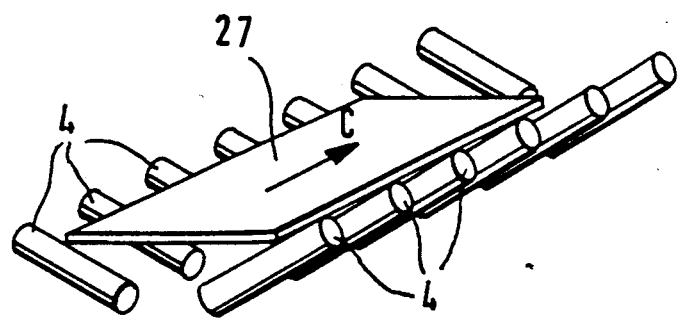
FIG. 4 shows in a perspective representation a detail of the conveyor apparatus according to FIG. 3.

A V-shaped conveyor apparatus 22, as is shown in FIGS. 3 and 4 and is adjustable to suit the format size, is preferred for rigid printed circuit boards.

The V-shaped conveyor apparatus 22 comprises two plate frames 20, 21 on which the conveyor rollers 4 are arranged parallel to one another on each plate frame. The inclination of the plate frames 20, 21, which can be swivelled around a common axis 26 of rotation, can be adjusted, with the aid of pneumatic cylinders 23, 24. The pneumatic cylinders 23, 24 are mounted laterally and virtually vertically on a basic frame 25 of the conveyor apparatus 22. The outer end of the piston rod 30 or 31 respectively of each of the two pneumatic cylinders 23, 24 is pivotably linked to the bottom side of the associated plate frame 20 or 21 respectively at an articulation point 28 or 29 respectively. The axis 26 of rotation is centrally arranged on a horizontal surface of the basic frame 25. The V-shaped design of the conveyor apparatus 22 achieves the result that only the lower edges of a printed circuit board 27, which is being conveyed in the direction of the arrow C in FIG. 4, are in contact with the conveyor rollers 4.

Whereas the printed circuit board bottom side assumes virtually the same temperature as the board top side in a conventional hot air or IR continuous oven during conveyance, in the drying apparatus according to the invention, some of the heat is removed from the bottom side of the board by the conveyor rollers which act as cooling rollers and consequently the exposure of the resist on the bottom side to heat is substantially reduced.

For example, in an infrared drying apparatus with a Teflon ® conveyor belt, a difference of 5° to 8° C. is measured between the board top side and bottom side of 1.5 mm thick boards made of epoxy resin insulating material clad with 35 μm thick copper for a board temperature of 80° C. In comparison thereto, the temperature difference in an infrared drying apparatus according to the invention between top side and bottom side of the boards is 19° to 25° C. under otherwise identical conditions.

Because the conveyor rollers 4 provided in the drying apparatus do not heat up during operation, heat is not fed to the contact points of the rollers with the bottom side of the boards, but heat is extracted instead. If enough heat is removed for the surface temperature of the resist coating on the bottom side to remain below the softening range of the resist, the possibility of the resist adhering to the conveyor rollers or of imprints being able to appear on the already resist-coated side is prevented. The softening region is to be understood to mean the temperature range in which a resist coating still does not exhibit any marking or imprint within a few seconds on a metal roller surface under the weight of the board. The required roller temperature depends on the amount of heat applied and the pass speed of the boards. Roller surface temperatures of +5° to +30° C. are preferred. Even higher temperatures can be employed with resists having low thermoplasticity.

The cooling zone 5 arranged downstream of the downstream drying zone 9 outside of the heating region serves to rapidly cool the boards 2. This is necessary, as a rule, in order to be able to convey the boards further immediately after drying by means of belts, straps or the like, to other stations such as, for example, exposure systems or stacking apparatuses. The cooling operation may be accelerated by blowing air on the boards 2 from the top side or the bottom side.

What is claimed is:

1. A method for continuously drying boards coated on both sides, comprising:
   a. conveying each of said boards horizontally through a drying zone via a plurality of conveyor rollers, said step of conveying comprising the steps of
      providing said conveyor rollers in the form of two rows of parallel conveyors mounted on respective plate frames which are inclined with respect to one another, and
      adjusting the inclination of each of said plate frames to accommodate different sized boards;
   b. heating a top surface of each of said boards as it passes through said drying zone; and
   c. cooling a bottom surface of each of said boards as it passes through said drying zone by cooling each of said conveyor rollers from the inside to thereby remove heat from each of said boards via contact with cooled circumferential surfaces of said conveyor rollers.

2. The method of claim 1, wherein the step of cooling comprises the step of feeding a coolant through each of said conveyor rollers.

3. The method of claim 2, wherein the step of feeding said coolant comprises the step of feeding said coolant through said conveyor rollers in an open flow system.

4. The method of claim 2, wherein the step of feeding said coolant comprises the step of feeding said coolant through said conveyor rollers in a closed circuit in which heat is removed from said coolant by one of a refrigerating system and a heat exchanger.

5. The method of claim 1, wherein the step of cooling comprises the step of maintaining the temperature of the circumferential surfaces of said conveyor rollers at or below $+30°$ C.

6. The method of claim 1, wherein said step of adjusting comprises the step of actuating pneumatic cylinders which are mounted laterally and virtually vertically to a basic frame located beneath said plate frames.

7. The method of claim 1, further comprising the step of conveying said boards out of said drying zone and through a cooling zone where they are rapidly cooled.

8. An apparatus for continuously drying boards coated on both sides while they are conveyed through a drying zone, comprising:
   a. a plurality of heat sources located within said drying zone;
   b. a plurality of conveyor rollers, located beneath said heat sources, which convey said boards horizontally through said drying zone, wherein each of said conveyor roller comprises
      (i) a hollow cooling roller having first and second opposed end faces,
      (ii) first and second hollow shaft journals connected to the respective end faces of said conveyor roller,
      (iii) first and second rotary distributors connected to the respective shaft journals,
      (iv) a coolant feed line connected to said first rotary distributor, and
      (v) a coolant outlet line connected to said second rotary distributor; and
   c. two inclined plate frames which are located in parallel with one another and the angle of inclination of each of which is adjustable about a common axis of rotation, wherein said plurality of said conveyor rollers are arranged on said plate frames to form a V-shaped conveyor apparatus.

9. The apparatus of claim 8, further comprising a cooling zone located immediately downstream of said drying zone, wherein said cooling zone comprises a plurality of cooled conveyor rollers.

10. The apparatus of claim 8, further comprising a pressure regulator located in said coolant feed line.

11. The apparatus of claim 10, further comprising a throttle, located in said coolant outlet line, for regulating the flow of fluid out of said conveyor roller.

12. The apparatus of claim 8, wherein said plurality of conveyor rollers are arranged in a horizontal plane parallel to one another.

13. The apparatus of claim 8, further comprising a pneumatic cylinder connected to each of said plate frames and a basic frame located beneath said plate frames, wherein each of said pneumatic cylinders is mounted laterally and virtually vertically on said basic frame.

14. The apparatus of claim 13, wherein the outer end of a piston rod of each of said pneumatic cylinders is pivotally linked to a bottom side of the associated plate frame at an articulation point.

15. The apparatus of claim 8, wherein an outer surface of each of said plurality of conveyor rollers is composed of a metallic material, whereby high heat reflection is achieved.

16. The apparatus of claim 8, wherein said coolant comprises one of air, water, a coolant composed of water, a lubricating additive, and an additive that delays aging of the water, and an organic compound.

17. An apparatus for continuously drying boards coated on both sides while they are conveyed through a drying zone, comprising:
   a. a plurality of heat sources located within said drying zone;
   b. a plurality of conveyor rollers, located beneath said heat sources, which convey said boards through said drying zone;
   c. two inclined plate frames which are located in parallel with one another and the angle of inclination of each of which is adjustable about a common axis of rotation, wherein said plurality of said conveyor rollers are arranged on said plate frames to form a V-shaped conveyor apparatus; and
   d. means, located within each of said conveyor rollers, for cooling the outer peripheral surface of each of said conveyor rollers, whereby the bottom surfaces of said boards are cooled by contacting the cooled surfaces of said conveyor rollers.

18. The apparatus of claim 17, wherein each of said conveyor rollers is hollow, and wherein said means for cooling comprises a coolant which flows through the hollow interior of each of said conveyor rollers.

* * * * *